United States Patent [19]

Satoh et al.

[11] Patent Number: 4,950,463
[45] Date of Patent: Aug. 21, 1990

[54] PURPLE DIAMOND AND METHOD OF PRODUCING THE SAME

[75] Inventors: Shuichi Satoh; Kazuwo Tsuji, both of Hyogo, Japan

[73] Assignee: Sumitomo Electric Industries, Ltd., Osaka, Japan

[21] Appl. No.: 272,725

[22] Filed: Nov. 17, 1988

[30] Foreign Application Priority Data

Nov. 17, 1987 [JP] Japan .................. 62-289748

[51] Int. Cl.$^5$ .............................. C01B 31/06
[52] U.S. Cl. ...................... 423/446; 156/DIG. 68; 501/86; 204/157.47
[58] Field of Search ............ 423/446; 156/DIG. 68; 378/38; 501/86; 204/157

[56] References Cited

U.S. PATENT DOCUMENTS

| | | | |
|---|---|---|---|
| 2,631,106 | 3/1953 | Mitkewich | 501/86 |
| 2,945,793 | 7/1960 | Dugdale et al. | 204/154 |
| 2,998,365 | 8/1960 | Casters et al. | 204/157 |
| 3,630,679 | 12/1971 | Angus | 423/446 |
| 4,124,690 | 11/1978 | Strong et al. | 423/446 |
| 4,174,380 | 11/1979 | Strong et al. | 423/446 |
| 4,301,134 | 11/1981 | Strong et al. | 423/446 |
| 4,399,364 | 8/1983 | Evans et al. | 423/446 |
| 4,638,484 | 1/1987 | Rand et al. | 372/42 |

FOREIGN PATENT DOCUMENTS

| | | | |
|---|---|---|---|
| 136408 | 4/1985 | European Pat. Off. | 423/446 |
| 2456766 | 12/1980 | France | 423/446 |

OTHER PUBLICATIONS

An article by A. T. Collins entitled "Vacancy Enhanced Aggregation of Nitrogen in Diamond", J. Phys. C.: Solid St. Phys. 13 (1980), pp. 2641 to 2650, Jan. 15, 1980.
Optical Absorption and Luminescence in Diamonds, John Walker, vol. 42, 1979.
Luminescence Decay Time of the 1.945eV Centre in Type Ib Diamond by A. T. Collins et al, Journal of Physics, pp. 2177-2181.

Primary Examiner—Robert L. Stoll
Assistant Examiner—Robert M. Kunemund
Attorney, Agent, or Firm—W. G. Fasse; D. H. Kane, Jr.

[57] ABSTRACT

A purple diamond has an absorption coefficient of the Ib type nitrogen at 500 nm, within the range of 0.2-2 cm$^{-1}$, an absorption coefficient of the N-V center at an absorption peak of 570 nm, within the range of 0.3-10 cm$^{-1}$, and absorption coefficients of the GR1 center, H2 center, H3 center, and H4 center which are less than 0.2 cm$^{-1}$ in the visible region. A method of producing such a purple diamond uses as a starting material an Ib type artificial synthetic diamond crystal wherein the Ib type nitrogen content in the crystal is within the range of $8 \times 10^{17}$–$1.4 \times 10^{19}$ atoms/cm$^3$, such a starting material is subjected to an electron beam irradiation of $5 \times 10^{16}$–$2 \times 10^{18}$ electrons/cm$^2$ at 2–4 MeV, and then annealing the irradiated diamond in a vacuum of less than $10^{-2}$ Torr, at a temperature of 800°–1100° C. for more than 25 hours.

3 Claims, No Drawings

PURPLE DIAMOND AND METHOD OF PRODUCING THE SAME

BACKGROUND OF THE INVENTION

1. Field of the Invention

The present invention relates to a purple diamond suitable, for example, for ornamental purposes and a method of producing such a purple diamond.

2. Background Information

To obtain a colored diamond, it has been usual practice to irradiate a natural diamond with an electron beam and then anneal the same under a vacuum atmosphere, so as to form a color center.

A color center is formed when a nitrogen atom in a crystal and a lattice defect formed by the irradiation of an electron beam are combined with each other by the action of annealing. Further, a lattice defect alone is also effective in forming a colored diamond. Further, the type of the color center is determined by the manner in which nitrogen atoms aggregate together. The relation between color centers and colors is shown in Table 1.

TABLE 1

| Center Name | Item State of Combination in Color Center | Color of Color Center |
|---|---|---|
| H3 Center | A pair of nitrogen atoms and a lattice defect | Yellow |
| H4 Center | Two pairs of nitrogen atoms and a lattice defect | Yellow |
| N-V Center | An isolated nitrogen atom and a lattice defect | Purple |
| GR1 Center | A lattice defect | Bluish green |
| N3 Center | Three nitrogen atoms (naturally occurring) | Light yellow |

For the methods of forming the color centers listed in Table 1 and their characteristics, reference is made to "Optical absorption and luminescence in diamonds," in Reports on Progress Physics, by John Walker, Vol. 42, 1979. Further, the true colors exhibited by colored diamonds are the colors indicated in Table 1 superposed on the intrinsic colors of natural rough diamonds.

The intrinsic colors of natural rough diamonds are classified as shown in Table 2.

TABLE 2

| Classification of Diamonds | Color of Rough Stone | Configuration in which Nitrogen Exists | | | | Proportion Occurring in Nature |
|---|---|---|---|---|---|---|
| | | Isolated nitrogen atoms | 1 pair of nitrogen atoms | 2 pairs of nitrogen atoms | 3 nitrogen atoms | |
| IIa | Transparent colorless | Absent | Absent | Absent | Absent | 1% |
| Ia | Transparent colorless | Absent | Present | Present | Absent | 10% |
| | Light yellow | Absent | Present | Present | Few | |
| | Yellow | Present | Present | Present | Present | 90% |
| | Brown | Many | Present | Present | Many | |
| IIb | Blue | Absent (containing B) | Absent | Absent | Absent | approximately 0% |
| Ib | Clear yellow | Present | Absent | Absent | Absent | 0.2% |

As is obvious from Table 2 and Table 1, those rough stones are colored effectively by making a color center indicated in Table 1 in type IIa or Ia diamonds which are transparent colorless or light yellow. These rough stones either do not have nitrogen at all or have 1 or 2 pairs of nitrogen atoms. Thus, it follows that coloration is effective for only two colors which follow, namely:

(1) Bluish green (based on the GR1 center formed solely by electron beam irradiation)
(2) Yellow (based on the H3 and H4 centers formed by electron beam irradiation and annealing).

From the above observation, we have concluded that a diamond which exhibits purple developed by the N-V center can hardly be produced from natural rough stones and that a purple diamond which induces a transparent sensation in the mind and whose color is brilliant cannot be produced from natural rough stones. Further, since the Ib type rough stone containing isolated type nitrogen alone for the production of the N-V center is present in as low as 0.2% of natural rough stones, it is very difficult to obtain such a rough stone itself.

Thus, we conceived the idea of using an Ib type artificial synthetic diamond which contains 100% isolated nitrogen. In addition, a method of producing the N-V center by electron beam irradiation and annealing is described by A. T. Collins, in "Journal of Physics C", Solid State Physics, 16 (pp. 2177-2181, 1983). However, to put a colored diamond to ornamental use, it should induces a transparent sensation in the mind and its color should be brilliant, a problem which has not been solved.

SUMMARY OF THE INVENTION

An object of the present invention is to provide a purple diamond which induces a transparent sensation in the beholder's mind and whose color is brilliant and a method of mass-producing the same.

A purple diamond according to the present invention is characterized in that the absorption coefficient of the Ib type nitrogen at 500 nm is 0.2-2 cm$^{-1}$, the absorption coefficient of the N-V center at an absorption peak of 570 nm is 0.3-10 cm$^{-1}$, and the absorption coefficients of the GR1 center, H2 center, H3 center and H4 center, are less than 0.2 cm$^{-1}$ in the visible region.

The method of producing a purple diamond according to the invention uses an Ib type artificial synthetic diamond crystal wherein the Ib type nitrogen content is within the range of $8 \times 10^{17}$- $1.4 \times 10^{19}$ atoms/cm$^3$. Such a diamond crystal is subjected to an electron beam irradiation of $5 \times 10^{16}$ - $2 \times 10^{18}$ electrons/cm$^2$ at 2-4 MeV, followed by annealing in a vacuum of less than 10$^{-2}$ Torr at a temperature of 800°-1100° C. for more than 25 hours.

In a purple diamond according to the invention the transparent sensation depends on the absorption coefficient of the N-V center and on the absorption coeffient of the Ib type nitrogen. For inducing a transparent sensation in the mind, it is important that this value has to be within the above mentioned range. On the other hand, in order to ensure the color brilliance of the present diamonds, it is important that the absorption coefficients of the other color centers have to be less than 0.2 cm$^{-1}$ in the visible region in addition to the restriction as to the absorption coefficients of said N-V center and Ib type nitrogen.

The absorption in the N-V center occurs from 500 nm to 640 nm, the peak value being 570 nm. Therefore, the center color of absorption is yellow. As a result of this absorption, the present crystals exhibit a complementary color, namely purple. This absorption plays an important role in determining the color of a purple diamond according to the invention.

The transparent sensation is an important factor in the ornamental use. This feature correlates to the absorption coefficient such that the transparent sensation is lost when the absorption coefficient exceeds 10 cm$^{-1}$. On the other hand, for an absorption coefficient of less than 0.3 cm$^{-1}$, the purple disappears, giving place to the yellow which is the intrinsic color of the rough stone.

The absorption of the type Ib nitrogen occurs at 550 nm. As the wavelength decreases, the absorption coefficient increases and becomes almost equal to infinity at 400 nm. The range in which absorption increases lies above 500 nm, where blue, indigo and purple colors are absorbed, with the crystals exhibiting a complementary color, namely yellow. If this yellow is light, it mixes with purple, exhibiting a clear purple color, inducing a transparent sensation in the mind of the beholder. This effect will not take place if the absorption coefficient at 500 nm is less than 0.2 cm$^{-1}$. If this absorption exceeds 2 cm$^{-1}$, the yellow is too dark for the crystals to induce a transparent sensation in the mind and predominates over purple so that purple disappears.

Regarding other types of absorption relating to the GR1 center, H2 center, H3 center, and H4 center, taking take place in the visible range, it is noted that the purple becomes turbid, decreasing the brilliant sensation. To maintain the brilliant sensation, it is important that this absorption coefficient be less than 0.2 cm$^{-1}$. Absorption peaks representative of other types of absorption taking place in the visible region include those from the GR1 center where absorption appears at 550-740 nm and the H2 center where absorption appears at 650-990 nm. Since these centers absorb colors which lie around red, excessively high absorption coefficients would cause green, which is a complementary color, to mix with purple, decreasing the brilliant sensation.

The present method uses an Ib type artificial synthetic diamond.

In the case of natural diamonds, annealing will produce a plurality of different types of color centers since such natural diamonds contain various forms of nitrogen atoms. Therefore, it is very difficult to obtain a rough stone which contains the N-V center alone by using a natural diamond.

Ib type artificial synthetic diamonds contain 100 % isolated type nitrogen atoms. For this reason, if an artificial synthetic diamond is used, a rough stone which contains the N-V center alone can be easily produced. In this case, a diamond synthesized by the temperature gradient method contains a smaller amount of bulk-like inclusions than does a diamond synthesized by the film growth method, resulting in large-sized crystals, a fact which is desirable.

The factor which is most closely correlated to the absorption coefficient of the N-V center and to the absorption coefficient of the Ib type nitrogen is the nitrogen content. If the nitrogen content is less than $8 \times 10^{17}$ atoms/cm$^3$, the absorption coefficient of the N-V center at 570 nm will be 0.2 cm$^{-1}$ or the absorption coefficient of the Ib type nitrogen at 500 nm will be less 0.3 cm$^{-1}$. Further, if the content exceeds $1.4 \times 10^{19}$ atoms/cm$^3$, the absorption coefficient of the N-V center will exceed 2 cm$^{-1}$ or the absorption coefficient of the Ib type nitrogen will exceed 10 cm$^{-1}$.

A uniform formation of lattice defects by electron beam irradiation is essential for uniform production of the N-V center throughout the crystals. Under the condition of irradiation with less than $5 \times 10^{16}$ electrons/cm$^2$ at 2 MeV, the lattice defect concentration will be decreased in some of the crystals. Further, above 4 MeV, there is a possibility that the inclusions will be irradiated. With an irradiation dose which exceeds $2 \times 10^{18}$ electrons/cm$^2$, the defect concentration will be too high, which causes the problem that the GR1 center cannot be removed or that the H2 center begins to form. In this case, there will be a high degree of absorption in the visible region due to other than the N-V center and Ib type nitrogen.

More than 25 hours of annealing satisfactorily eliminates the GR1 center produced by electron beam irradiation and ensures a satisfactory combination between the Ib type nitrogen and lattice defects. With less than 25 hours of annealing, however, said effects cannot be attained to the fullest extent. Further, with a vacuum exceeding $10^{-2}$ Torr, graphitization of the diamond surface will occur. If the annealing temperature is less than 800° C., the GR1 center cannot be fully removed, while if it exceeds 1100° C., the N-V center begins to be destroyed and the purple is lightened.

According to the invention, a purple diamond which induces a transparent sensation in the mind of the beholder and which has a brilliant color can be obtained. Furthermore, according to the present method of producing a purple diamond is obtained by using an artificial synthetic diamond. Hence, it is easy to procure the necessary rough stone and hence purple diamonds can be mass-produced.

Example 1

Seven Ib type artificial synthetic diamonds having a nitrogen content of $4 \times 10^{17}$ to $4 \times 10^{19}$ atoms/cm$^3$, were synthesized by the temperature gradient method and subjected to an electron beam irradiation using $1 \times 10^{16}$ to $2 \times 10^{19}$ electrons/cm$^2$ at 3 MeV. Subsequently, the so treated diamonds were subjected to 30 hours of annealing in a vacuum of $10^{-3}$ Torr at 900° C.

The diamonds so obtained were tested for the absorption coefficient of the N-V center, Ib type nitrogen, GR1 and H2 centers by using an ultraviolet visible spectroscope.

Further, said samples were brilliant-cut into pieces having 0.5-0.6 carat each. These pieces were evaluated as to their ornamental use by one hundred randomly selected women aged 18-65 who were requested to observe the pieces and information on the following subjects was gathered through this questionnaire. The result is shown in Table 3.

The following questions were asked in the questionnaire.

(1) Does it induce a transparent sensation in the mind?
(2) Is the color brilliant?
(3) Does it have an ornamental value?

TABLE 3

| Sample No. | | 1 | 2 | 3 | 4 | 5 | 6 | 7 |
|---|---|---|---|---|---|---|---|---|
| Ultraviolet visible spectroscopic analysis | N-V center absorption coefficient ($cm^{-1}$) | 0.4 | 0.1 | 0.3 | 0.6 | 10 | 8 | 15 |
| | Ib type nitrogen absorption coefficient ($cm^{-1}$) | 0.15 | 0.2 | 0.2 | 0.3 | 2 | 3 | 2 |
| | Other-center absorption coefficient ($cm^{-1}$) | Approximately 0 | Approximately 0 | Approximately 0 | Approximately 0 | 0.1 or less | Approximately 0 | 0.1 or less |
| Nitrogen concentration of rough stone (atoms/$cm^3$) | | $8 \times 10^{17}$ | $4 \times 10^{17}$ | $8 \times 10^{17}$ | $1.7 \times 10^{18}$ | $1.4 \times 10^{19}$ | $5 \times 10^{19}$ | $3 \times 10^{19}$ |
| Electron beam irradiation dose (electrons/$cm^2$) | | $3 \times 10^{16}$ | $2 \times 10^{18}$ | $5 \times 10^{16}$ | $1 \times 10^{18}$ | $2 \times 10^{18}$ | $5 \times 10^{16}$ | $2 \times 10^{18}$ |
| Result of questionnaire | Transparent sensation (persons) | 100 | 100 | 100 | 100 | 80 | 40 | 10 |
| | Color brilliantness (persons) | 52 | 30 | 90 | 100 | 85 | 10 | 20 |
| | Ornamental value (persons) | 48 | 30 | 90 | 100 | 75 | 18 | 5 |
| | | Control | Control | Example | Example | Example | Control | Control |

In addition, the result of the questionnaire shown in Table 3 indicates the number of persons who answered "Yes".

Example 2

Three Ib type synthetic diamonds having a nitrogen content of $2 \times 10^{18}$ atoms/$cm^3$, were synthesized by the temperature gradient method and subjected to an electron beam irradiation using $2 \times 10^{18}$ to $1 \times 10^{19}$ electrons/$cm^2$ at 3 MeV. Subsequently, these diamonds were subjected to 10–40 hours of annealing in a vacuum of $10^{-4}$ Torr at 1100° C.

The samples obtained were tested for the absorption coefficient of the N-V center, Ib type nitrogen, GR1 center and H2 center by using an ultraviolet visible spectroscope.

Further, said samples were brilliant-cut into pieces having 0.8–1.2 carat each. These pictures were evaluated as to their ornamental use by a questionnaire in the same manner as in Example 1, and the result is shown in Table 4.

TABLE 4

| Sample No. | | 1 | 2 | 3 |
|---|---|---|---|---|
| Ultraviolet visible spectroscopic analysis ($cm^{-1}$) | N-V center absorption coefficient ($cm^{-1}$) | 0.7 | 0.6 | 0.7 |
| | Ib type nitrogen absorption coefficient ($cm^{-1}$) | 0.3 | 0.3 | 0.3 |
| | Other-center absorption coefficient ($cm^{-1}$) | Approximately 0 | 0.3 | 3.5 |
| Electron beam irradiation dose (electrons/$cm^2$) | | $2 \times 10^{18}$ | $2 \times 10^{18}$ | $1 \times 10^{19}$ |
| Annealing time (hours) | | 25 | 10 | 40 |
| Result of questionnaire | Transparent sensation (persons) | 100 | 98 | 0 |
| | Color brilliantness (persons) | 100 | 55 | 5 |
| | Ornamental value (persons) | 100 | 45 | 0 |
| | | Example | Control | Control |

In addition, the result of the questionnaire shown in Table 4 indicates the number of persons who answered "Yes".

Although the present invention has been described in detail, it is clearly understood that the same is by way of example only and is not to be taken by way of limitation, the spirit and scope of the present invention being limited only by the terms of the appended claims.

What is claimed is:

1. A diamond, comprising an Ib-type synthetic diamond crystal having an Ib-type nitrogen content in the crystal within the range of $8 \times 10^{17}$ to $1.4 \times 10^{19}$ atoms/$cm^3$, and a first absorption coefficient of Ib-type nitrogen at 500 nm, within the range of 0.2–2 $cm^{-1}$, a second absorption coefficient of the N-V center at an absorption peak of 570 nm, within the range of 0.3–10 $cm^{-1}$, and third absorptin coefficients of the GR1 center, the H2 center, the H3 center, and the H4 center of less than 0.2 $cm^{-1}$, in the visible region, said first and second absorption coefficients assuring a transparency of said diamond, said third absorption coefficients assuring a distinct purple color brilliance.

2. A method of producing a diamond, comprising the following steps:
(a) using an Ib-type synthetic diamond crystal having an Ib-type nitrogen content in the crystal within the range of $8 \times 10^{17}$–$1.4 \times 10^{19}$ atoms/$cm^3$,
(b) subjecting said diamond crystal to an electron beam irradiation of $5 \times 10^{16}$–$2 \times 10^{18}$ electrons/$cm^2$ at 2 to 4 MeV, and
(c) annealing in a vacuum of less than $10^{-2}$ Torr at a temperature of 800°–1100° C. for more than 25 hours, for producing a transparent diamond having a distinctly purple color brilliance, whereby said diamond crystal has a first absorption coefficient of Ib-type nitrogen at 500 nm, within the range of 0.2–2 $cm^{-1}$, a second absorption coefficient of the N-V center at an absorption peak of 570 nm, within the range of 0.3–10 cm$^{-1}$, and third absorption coefficients of the GR1 center, the H2 center, the H3 center, and the H4 center of less than 0.2 cm$^{-1}$, in the visible region for achieving said transparent distinctly purple color brilliance.

3. The method of claim 2, wherein said synthetic diamond crystal is synthesized by a temperature gradient method.

* * * * *